United States Patent [19]
Johnson

[11] Patent Number: 5,832,014
[45] Date of Patent: Nov. 3, 1998

[54] WAVELENGTH STABILIZATION IN TUNABLE SEMICONDUCTOR LASERS

[75] Inventor: John Evan Johnson, New Providence, N.J.

[73] Assignee: Lucent Technologies Inc., Murray Hill, N.J.

[21] Appl. No.: 799,653

[22] Filed: Feb. 11, 1997

[51] Int. Cl.⁶ ................................................ H01S 3/13
[52] U.S. Cl. ........................... 372/32; 372/38; 372/20; 372/50; 372/96
[58] Field of Search .................... 372/32, 26, 35, 372/38, 20, 29, 50, 96

[56] References Cited

U.S. PATENT DOCUMENTS

| | | | |
|---|---|---|---|
| 3,486,131 | 12/1969 | Smith | 372/32 |
| 3,711,786 | 1/1973 | Vautier et al. | 372/32 |
| 4,103,254 | 7/1978 | Chikami | 372/32 |
| 4,309,671 | 1/1982 | Malyon | 372/32 |
| 4,719,636 | 1/1988 | Yamaguchi | 372/26 |
| 4,821,273 | 4/1989 | Hori | 372/31 |
| 4,905,243 | 2/1990 | Lokai et al. | 372/32 |
| 4,920,542 | 4/1990 | Brosson et al. | 372/26 |
| 4,947,398 | 8/1990 | Yasuda et al. | 372/32 |
| 4,953,169 | 8/1990 | Schlemmer et al. | 372/32 |
| 4,964,132 | 10/1990 | Fischer | 372/32 |
| 5,157,681 | 10/1992 | Aoyagi et al. | 372/26 |
| 5,170,402 | 12/1992 | Ogita et al. | 372/26 |
| 5,384,799 | 1/1995 | Osterwalder | 372/32 |
| 5,473,625 | 12/1995 | Hansen et al. | 372/96 |
| 5,636,233 | 6/1997 | Sato et al. | 372/31 |

*Primary Examiner*—Leon Scott, Jr.

[57] ABSTRACT

Methods and apparatus for stabilizing or otherwise controlling wavelength in tunable semiconductor lasers and other optical sources. A tunable semiconductor laser includes a gain section and at least one tuning section. Spontaneous emission (SE) from the tuning section is detected and used in a feedback control loop to control the amount of current applied to the tuning section. The SE may be detected using an integrated detector on the semiconductor laser chip, an external detector arranged adjacent the chip to detect SE emitted from a side of the tuning section, or an external detector arranged to detect SE coupled from an optical fiber or other signal line connected to an optical signal output of the laser. The feedback control loop may operate to maintain the detected SE at a constant level, such that the current applied to the tuning section is adjusted to compensate for the effects of aging and the laser output wavelength is thereby stabilized. The invention may also be implemented using multiple feedback control loops to control the current supplied to corresponding multiple tuning sections of a given optical source. Each of the multiple feedback control loops may operate to maintain the SE detected from a corresponding one of the tuning sections at a constant level, such that the output wavelength is stabilized.

22 Claims, 4 Drawing Sheets

WAVELENGTH STABILIZATION IN TUNABLE SEMICONDUCTOR LASERS

FIELD OF THE INVENTION

The present invention relates generally to tunable lasers and other tunable optical signal sources, and more particularly to techniques for stabilizing the wavelength of an optical signal generated by a tunable optical signal source.

BACKGROUND OF THE INVENTION

A major obstacle to the widespread commercialization of tunable semiconductor lasers is long-term wavelength stability. In many tunable lasers, the output wavelength is controlled by injecting current into a tuning section in order to alter refractive index via the plasma effect. For example, in a typical two-section distributed Bragg reflector (DBR) laser having a gain section and a tuning section, the output wavelength is tuned by changing the Bragg wavelength $\lambda_B$ of the tuning section in accordance with the following equation:

$$\lambda_B = 2n_{eff}\Lambda_g$$

in which $n_{eff}$ is the effective refractive index of the tuning section and $\Lambda_g$ is the grating pitch of a grating in the tuning section. The output wavelength is thus a function of the refractive index which in turn is proportional to the carrier density in an active semiconductor layer of the tuning section.

In many practical applications it is desirable to operate the laser in a "set-and-forget"mode in which the tuning current applied to the active layer is substantially constant. However, as the current-tuned laser ages under constant current bias conditions, the carrier density tends to decrease due to factors such as the nucleation of non-radiative defects or increased leakage around the active layer, thus causing the wavelength to drift. The drift can be significant and may even cause the laser to undergo large discrete mode hops. Additional details regarding the wavelength stabilization problems of DBR lasers may be found in, for example, S. L. Woodward et al., "The Effects of Aging on the Bragg Section of a DBR laser," IEEE Photonics Technology Letters, Vol. 5, No. 7, pp. 750–752, July 1993, which is incorporated by reference herein.

Conventional approaches to solving the wavelength stabilization problem in tunable semiconductor lasers generally involve monitoring the lasing wavelength using precise filters. Exemplary filtering techniques are described in, for example, T. Coroy et al., "Active Wavelength Measurement System Using an InGaAs—InP Quantum-Well Electroabsorption Filtering Detector," IEEE Photonics Technology Letters, Vol. 8, No. 12, pp. 1686–1688, December 1996, M. Teshima and M. Koga, "100-GHz-Spaced 8-Channel Frequency Control of DBR Lasers for Virtual Wavelength Path Cross-Connect System," IEEE Photonics Technology Letters, Vol. 8, No. 12, pp. 1701–1703, December 1996, and C. R. Giles and T. L. Koch, "Method for Setting the Absolute Frequency of a Tunable, 1.5 μm Two-Section DBR Laser," IEEE Photonics Technology Letters, Vol. 2, No. 1, pp. 63–65, January 1990, all of which are incorporated by reference herein. However, these filtering techniques can be expensive and difficult to implement in many practical applications. Moreover, the required filters are often unsuitable for integration with the semiconductor laser on a single chip.

Another conventional wavelength stabilization technique is described in S. L. Woodward et al., "A Control Loop Which Ensures High Side-Mode-Suppression Ratio in a Tunable DBR Laser," IEEE Photonics Technology Letters, Vol. 4, No. 5, pp. 417–419, May 1992, which is incorporated by reference herein. This technique utilizes a feedback control loop for adjusting the current applied to a tuning section of a DBR laser based on a measurement of laser light passing through the tuning section. The laser light is detected in an integrated detector, and the control loop adjusts the tuning current so that the output wavelength of the laser light is constantly in the center of the Bragg band. The control loop ensures that the DBR laser remains in single-mode operation despite the effects of aging. However, the technique is operable with only a narrow range of tunable DBR laser designs, and is generally not suitable for use with a tunable laser which is to be operated at a wavelength other than that corresponding to the center of the Bragg band.

It is therefore apparent that a need exists for an improved technique for stablizing wavelength in tunable semiconductor lasers, which avoids the cost, complexity and other problems associated with the conventional approaches.

SUMMARY OF THE INVENTION

The present invention provides methods and apparatus for wavelength stabilization in a tunable semiconductor laser or other optical signal source. The invention generally involves detecting spontaneous emission (SE) from a tuning section of the tunable laser, and utilizing the detected SE to drive a feedback control loop which provides current to the tuning section.

In accordance with one aspect of the invention, a wavelength-controlled tunable optical signal source is provided which includes a gain section and at least one tuning section. A detector is utilized to detect SE from the tuning section of the optical signal source. The detector may be integrated with the gain section and tuning section into a single chip, or may be arranged adjacent the chip so as to detect SE from a side of the tuning section. In either case, one or more isolation regions may be formed on the chip in order to isolate the detector from SE generated by the gain section as well as from laser light scattered by the gain section. In other embodiments, the SE may be detected by coupling a portion of the optical signal power from an output fiber to an external detector. The coupling from the output fiber may be implemented using an optical splitter, a wavelength division multiplexed (WDM) coupler, or other suitable optical signal coupler. Filtering may be used before the detector in order to reject any gain section SE or laser light coupled from the output fiber. The detected SE from either an internal or external detector is then utilized in a feedback control loop to control the optical signal wavelength. For example, the feedback control loop may operate to maintain the detected tuning section SE at a substantially constant level such that the output laser light wavelength is stabilized despite reductions in active layer carrier density due to effects such as aging.

In accordance with another aspect of the invention, the output wavelength of a tunable optical source with multiple tuning sections may be stabilized using corresponding multiple SE detectors and feedback control loops. For example, a multi-section DBR laser may include a gain section, a DBR tuning section and a phase tuning section. A first integrated or external SE detector associated with the DBR tuning section detects SE from the DBR tuning section and drives one input of a first voltage-controlled current source. The current source controls the amount of current supplied to the DBR tuning section such that the SE detected from the DBR tuning section is maintained at a first level. A second integrated or external SE detector associated with the phase tuning section detects SE from the phase tuning section and drives one input of a second voltage-controlled current source. The second current source controls the current supplied to the phase tuning section such that the SE detected from the phase tuning section is maintained at a second level. Electrical isolation between the two SE detectors may be provided by suitably-arranged etched or implanted isolation regions. This allows separate control of the DBR and phase tuning section SE even in applications in which the spectra of the DBR tuning section SE overlaps with that of the phase tuning section SE. The present invention may thus be implemented in tunable sources having multiple tuning sections by using multiple feedback control loops, with each of the loops controlling output laser light wavelength in accordance with SE detected from a particular tuning section.

The present invention provides wavelength stabilization techniques which are simpler to implement and less costly than conventional stabilization techniques such as those involving precise filtering. For example, the invention may be implemented using an SE detector or detectors suitable for integration with a tunable semiconductor laser in a single chip. These and other features and advantages of the present invention will become more apparent from the accompanying drawings and the following detailed description.

DETAILED DESCRIPTION OF THE INVENTION

The present invention will be illustrated below in conjunction with exemplary tunable semiconductor lasers. It should be understood, however, that the invention is not limited to use with any particular type of laser, but is instead more generally applicable to any optical source in which wavelength may be stabilized by feedback control of detected spontaneous emission (SE). For example, the invention is suitable for use with a simple two-section distributed Bragg reflector (DBR) tunable laser having a gain section and a single tuning section, as well as with more complex devices such as a four-section tunable superstructure grating DBR laser having a gain section, two DBR tuning sections and one phase tuning section. The invention may also be used with non-DBR tunable lasers. The term "tunable laser" as used herein is thus intended to include any type of optical signal source in which output wavelength can be tuned or otherwise adjusted by varying tuning section current injection or any other operating parameter of the source. The term "stabilization" is intended to include not only maintaining an output wavelength at a particular predetermined value, but also other types of wavelength control including providing a desired variation pattern for the output wavelength over time, temperature or other operating condition. The term "spontaneous emission" is intended to include any type of noise or other signal or signals emitted by a laser or other optical source which is proportional to active layer carrier density and thus output wavelength. The term "tuning section" is intended to include both DBR grating tuning sections and phase tuning sections, as well as other types of tuning sections. The term "laser light" is used herein to refer to the desired primary optical signal generated by a laser or other optical source.

Wavelength stabilization in accordance with the present invention is provided by monitoring the spontaneous emission (SE) from a tuning section of a tunable laser. The present invention is based in part on the fact that SE from a tuning section of a DBR laser or other type of tunable laser is generally proportional to carrier density in an active layer or layers of the tuning section. The detected tuning section SE may therefore be used in a feedback control loop which stabilizes output wavelength by maintaining the detected SE and thus the active layer carrier density at desired levels. For example, the feedback control loop may be used to maintain a detected SE signal at a predetermined constant level, such that the active layer carrier density and thus the effective refractive index $n_{\mathit{eff}}$ of the tuning section also remain constant, resulting in output laser light having a substantially constant wavelength.

Figure 1:
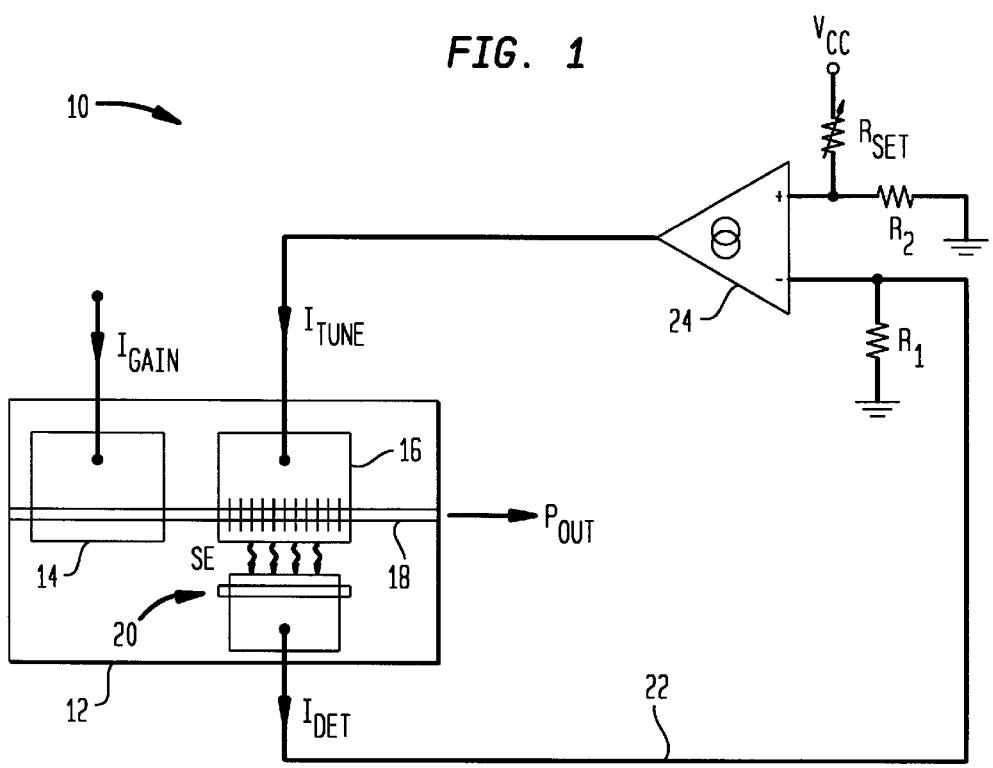
FIG. 1 shows an exemplary tunable semiconductor laser with wavelength stabilization using an integrated detector to detect spontaneous emission (SE) from a tuning section of the laser in accordance with the invention.

FIG. 1 shows an exemplary wavelength-stabilized tunable semiconductor laser 10 in accordance with the present invention. The laser 10 includes a tunable DBR chip 12 having a gain section 14 and a tuning section 16. The gain section 14 is driven by a gain current $I_{gain}$ while the tuning section 16 is driven by a tuning current $I_{tune}$. An optical waveguide 18 passes over or through the gain section 14 and tuning section 16 of the DBR chip 12. The tuning section 16 includes a grating shown in this illustration as a number of parallel vertical lines intersecting the waveguide 18. The DBR chip 12 generates an output optical signal having a particular wavelength, and a total optical output $P_{out}$. The DBR chip 12 is a two-section laser in which the output wavelength is controlled by altering the magnitude of the current $I_{tune}$ injected into the tuning section 16 and thereby the refractive index $n_{\mathit{eff}}$ of the tuning section. The output wavelength is also a function of the grating pitch $\Lambda_g$, which corresponds to the distance between adjacent grating elements of the grating in the tuning section 16.

The wavelength-stabilized laser 10 further includes an integrated SE detector 20. The detector 20 is integrated into the DBR chip 12 along with the gain section 14 and tuning section 16. The detector 20 is sensitive to the wavelength or wavelengths of SE emitted from the tuning section 16, and is arranged adjacent the tuning section 16 in order to receive the SE as shown by the arrows entering the detector 20 in FIG. 1. The detector 20 generates a detected SE current signal $I_{det}$ which is proportional to the amount of detected SE. The detected SE current signal $I_{det}$ is supplied via a feedback line 22 to a first input of a voltage-controlled current source 24. The first input of the current source 24 is connected to ground potential via a resistor $R_1$. A second input of the current source 24 is connected to a voltage source Vcc via a variable resistor $R_{set}$, and is connected to ground potential via a resistor $R_2$. The resistor $R_{set}$ is varied to change a set-point voltage present at the second input of the current source 24. The current source 24 generates the tuning current $I_{tune}$ which is supplied to the tuning section 16 of DBR chip 12 to control the active layer current density, and thereby the effective refractive index $n_{eff}$ and output optical signal wavelength, in the manner previously described. The wavelength-stabilized laser 10 in this embodiment thus includes a feedback control loop comprising integrated SE detector 20, line 22 and voltage-controlled current source 24. The feedback control loop operates to adjust the tuning current $I_{tune}$ such that the detected SE produces a corresponding voltage at the first input of the current source 24 which matches the set-point voltage at the second input of the current source 24. In this manner, the feedback control loop of FIG. 1 operates to maintain a substantially constant amount of detected SE, and thus a substantially constant active layer carrier density, effective refractive index $n_{eff}$ and output laser light wavelength.

Figure 2A:
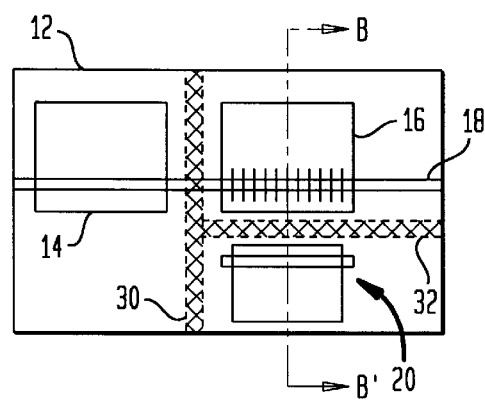
FIG. 2A is a more detailed view of a portion of the tunable laser of FIG. 1.
Figure 2B:
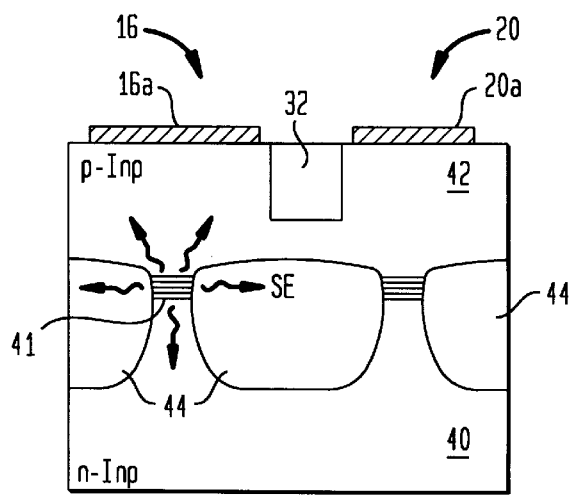
FIG. 2B is a cross-sectional view of the portion of the tunable laser shown in FIG. 2A.

FIGS. 2A and 2B show the exemplary DBR chip 12 of FIG. 1 in greater detail. FIG. 2A shows that the chip 12 has been configured in this embodiment to include a first electrical isolation region 30 separating the gain section 14 from the tuning section 16 and the integrated detector 20, and a second electrical isolation region 32 separating the tuning section 16 from the integrated detector 20. The isolation regions 30, 32 may be implemented as trenches or implanted regions, and are designed to reduce the amounts of non-SE light and gain section SE light which are incident on the integrated detector 20. FIG. 2B shows a cross-sectional view of the DBR chip 12 along the section line B–B' of FIG. 2A. It can be seen that the DBR chip 12 is a multilayer structure which in this embodiment includes a substrate 40 of n-type InP, active regions 41 and 43 comprising a number of substantially intrinsic InGaAsP layers, and an upper cladding region 42 of p-type InP. The upper cladding region 42 may also include one or more InGaAsP layers. The multilayer structure further includes a number of current-blocking regions 44 formed by multiple layers of InP doped such that carriers injected from the n-type and p-type InP regions 40 and 42 are laterally confined to the intrinsic active regions 41 and 43. The electrical isolation region 32 is located between electrical contact layers 16a of tuning section 16 and electrical contact layers 20a of detector 20.

The regions 40, 41, 42, 43 and 44 of the DBR chip 12 generally form a number of positive-intrinsic-negative (p-i-n) diode structures. The p-i-n diode structure associated with the tuning section 16, formed by regions 42, 41 and 40, is generally arranged to provide maximum electrical confinement of injected carriers as well as optical confinement of the laser light generated in gain section 14. In operation, the p-i-n diode structure associated with the tuning section 16 is generally forward-biased, causing SE to be emitted from active region 41 as shown generally by the wavy arrows in FIG. 2B. The p-i-n diode structure associated with the integrated detector 20, formed by regions 42, 43 and 40, is generally arranged to absorb a portion of the SE emitted by region 41. In operation, the p-i-n diode structure associated with the integrated detector 20 is generally reverse-biased. The exemplary multilayer structure shown in FIG. 2B is of the type formed using a conventional capped-mesa buried heterostructure (CMBH) laser process. It should be noted that the invention may be implemented using tunable lasers formed with a wide variety of other structures using any of a number of other types of processes.

Figure 3:
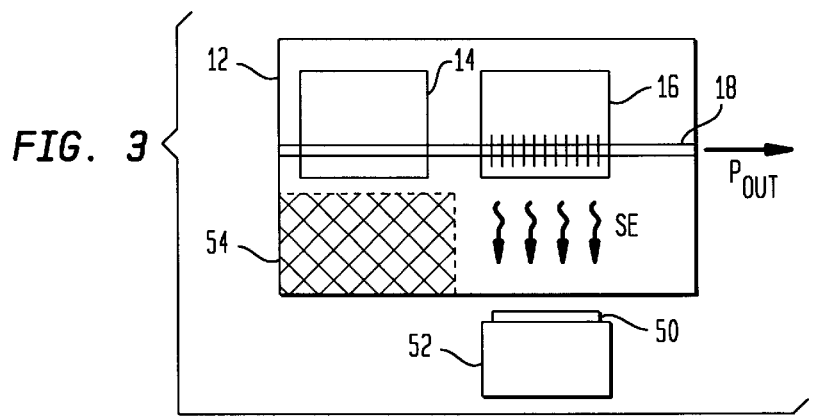
FIG. 3 shows an exemplary implementation of an external SE detector suitable for use in providing wavelength stabilization in accordance with the present invention.
Figure 4:
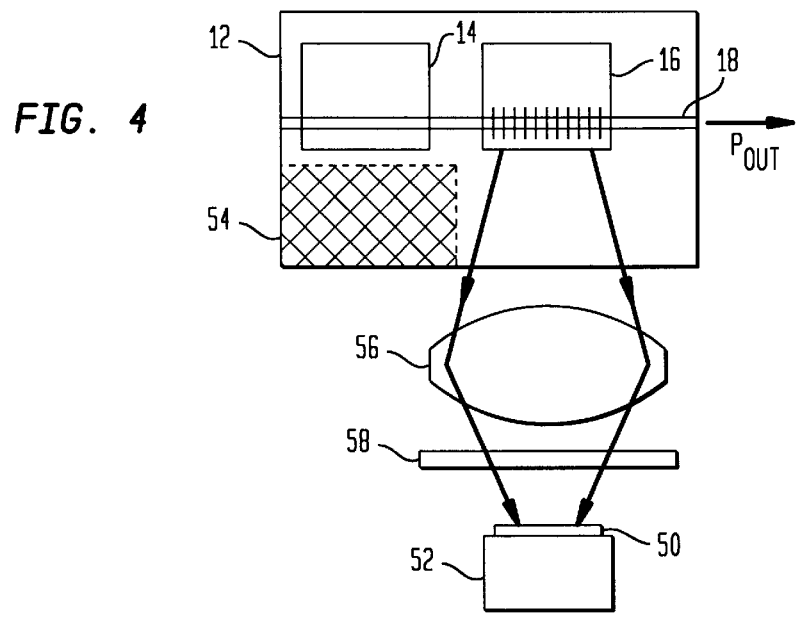
FIG. 4 shows another exemplary implementation of an external SE detector suitable for use in providing wavelength stabilization in accordance with the invention.

FIGS. 3 and 4 show two exemplary embodiments of the invention in which the integrated SE detector 20 of the wavelength-stabilized laser 10 of FIG. 1 is replaced with an external SE detector. FIG. 3 shows the DBR chip 12 with gain section 14, tuning section 16 and waveguide 18 as previously described. SE from the tuning section is detected in FIG. 3 by a p-i-n diode detector 50 supported by a mounting block 52. The detector 50 is arranged with its front surface adjacent a side edge of the DBR chip 12 so as to receive SE from the corresponding side of the tuning section as shown. The DBR chip 12 includes an isolation region 54 which may be implemented as a trench or implanted region. The isolation region 54 reduces the amounts of gain section SE and scattered laser light which are incident on the external p-i-n diode detector 50. The external detector 50 may also include an integrated filter on its front surface to provide additional rejection of gain section SE and scattered laser light. FIG. 4 shows the DBR chip 12 with gain section 14, tuning section 16, waveguide 18, external p-i-n diode detector 50, mounting block 52 and isolation region 54 as previously described. The FIG. 4 embodiment also includes a lens 56 which collects SE from the tuning section 16, and focuses it onto the external detector 50. A filter 58 is arranged between the lens 56 and the detector 50 to provide additional rejection of the gain section SE and scattered laser light. Although the FIG. 4 embodiment is generally more bulky than the FIG. 3 embodiment, it may provide better sensitivity in detecting tuning section SE as well as better rejection of gain section SE and scattered laser light in certain applications.

Figure 5:
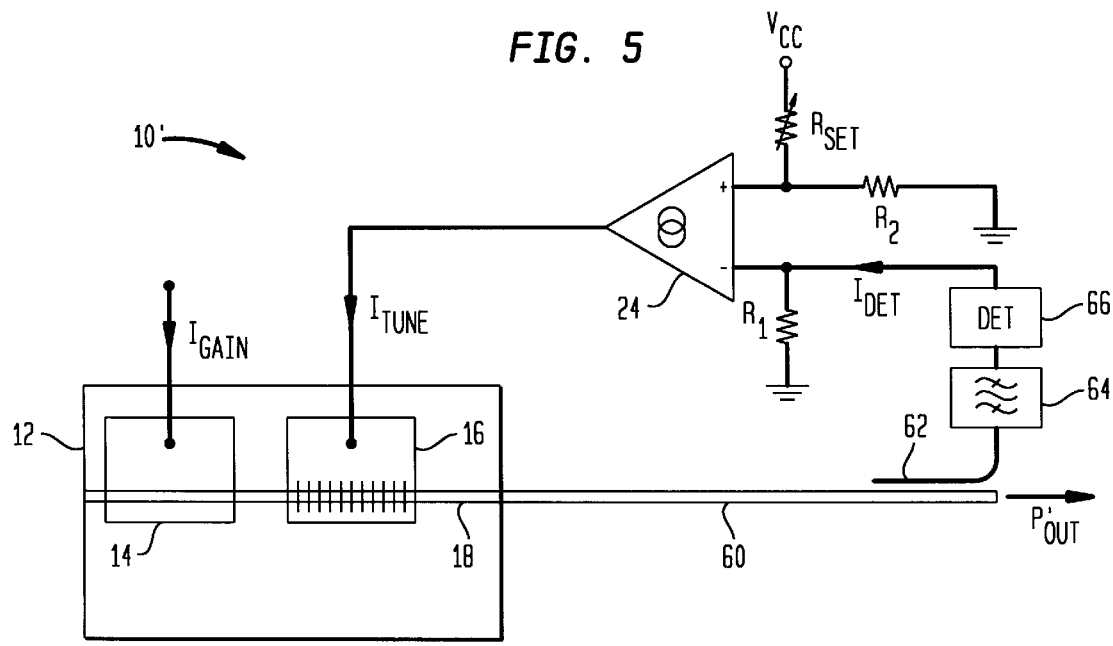
FIG. 5 shows an exemplary tunable semiconductor laser with wavelength stabilization using an in-line monitoring technique to detect SE from a tuning section of the laser in accordance with the invention.

FIG. 5 shows a wavelength-stabilized tunable laser 10' in which the tuning section SE is monitored in an optical fiber 60 coupled to an output of the DBR chip 12. The optical fiber 60 may be a conventional single-mode optical fiber. The DBR chip 12 generates a total optical output $P_{out}$ which is coupled to the fiber 60 in a conventional manner. The optical output $P_{out}$ includes SE from the gain section 14, SE from the tuning section 16 and laser light at a wavelength which is a function of the tuning current $I_{tune}$ applied to the tuning section 16. A portion of the total optical output $P_{out}$ on fiber 60 is coupled via an optical coupler 62 to an input of a bandpass filter 64. The remaining portion $P_{out}'$ of the total optical output $P_{out}$ appears at the output of the optical fiber 60. The coupler 62 may be implemented as an optical splitter or other suitable type of optical signal coupler, and may be configured such that about 1% to 10% of the optical signal power generated by DBR chip 12 is coupled to the input of the bandpass filter 64. The bandpass filter 64 is designed to pass the wavelengths of the tuning section SE, while blocking the wavelengths of the gain section SE and the laser light.

Figure 6:
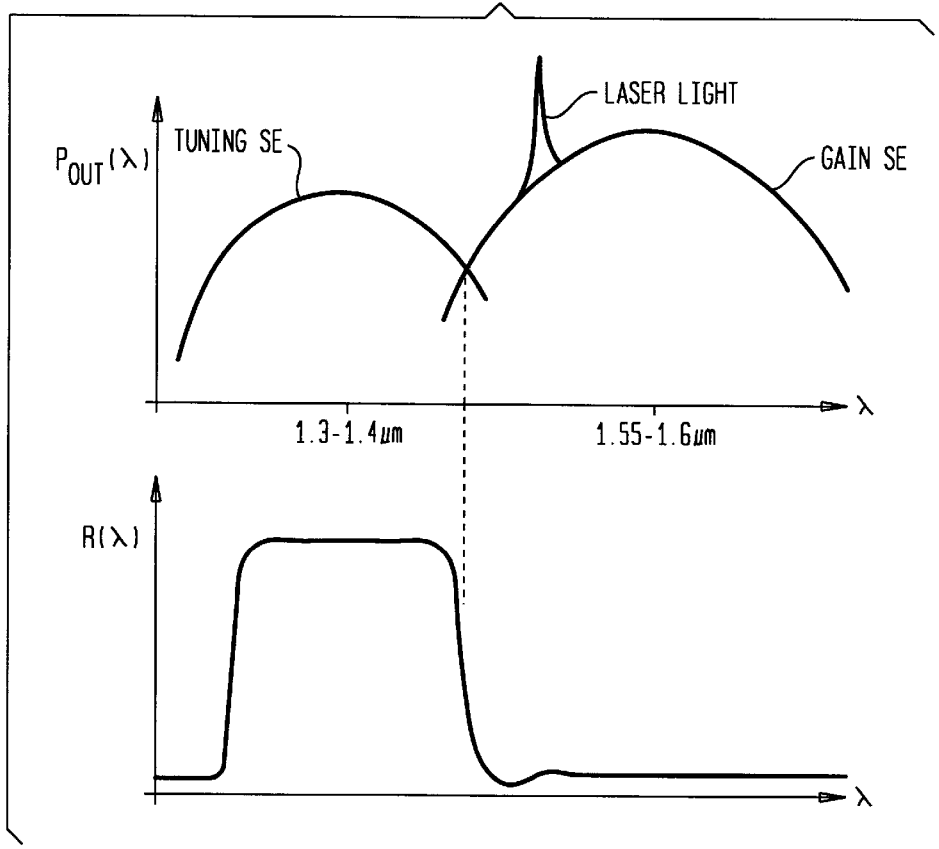
FIG. 6 shows an exemplary optical spectrum in the monitored line of FIG. 5 and a corresponding response of a bandpass filter suitable for use with the in-line monitoring technique of FIG. 5.

FIG. 6 shows an exemplary spectral plot of the total optical output $P_{out}$ of the DBR chip 12 as a function of wavelength λ and a corresponding response R(λ) for the bandpass filter 64. The $P_{out}(\lambda)$ plot shows the tuning section SE centered at a wavelength of about 1.3 to 1.4 μm, the gain section SE centered at a wavelength of about 1.55 to 1.6 μm, and the laser light. The response R(λ) of the bandpass filter 64 is centered at the 1.3 to 1.4 λm center wavelength of the tuning section SE, and thus passes the tuning section SE while attenuating the gain section SE and the laser light. The specific characteristics of the bandpass filter used in a given application will generally depend on factors such as the relative wavelengths and power levels of the tuning section SE, gain section SE and laser light. In alternative embodiments, the bandpass filter 64 may be replaced with a low pass filter designed to pass the tuning section SE while rejecting the gain section SE and laser light.

Referring again to FIG. 5, the filtered tuning section SE is applied to an SE detector 66 to generate a detected SE current signal $I_{det}$ which is applied to an input of the voltage-controlled current source 24. The source 24 generates the tuning current $I_{tune}$ applied to the tuning section 16 to control the wavelength of the laser light generated by the DBR chip 12. The source 24 alters the current $I_{tune}$ such that the voltage generated across the resistor $R_1$ by the detected SE current signal $I_{det}$ at the first input of the source 24 is substantially equivalent to a set-point voltage generated at the second input of source 24 by the voltage divider of resistor $R_2$ and variable resistor $R_{set}$. The wavelength-stabilized laser of FIG. 5 thus includes a feedback control loop comprising optical coupler 62, bandpass filter 64, SE detector 66 and voltage-controlled current source 24. Like the corresponding control loop of FIG. 1, the feedback control loop of FIG. 5 operates to adjust the tuning current $I_{tune}$ such that the detected tuning section SE produces a voltage at the first input of the current source 24 which matches the set-point voltage at the second input of the current source 24. The feedback control loop of FIG. 5 maintains a substantially constant amount of detected tuning section SE, and thus a substantially constant active layer carrier density, effective refractive index $n_{eff}$ and output laser light wavelength.

Figure 7:
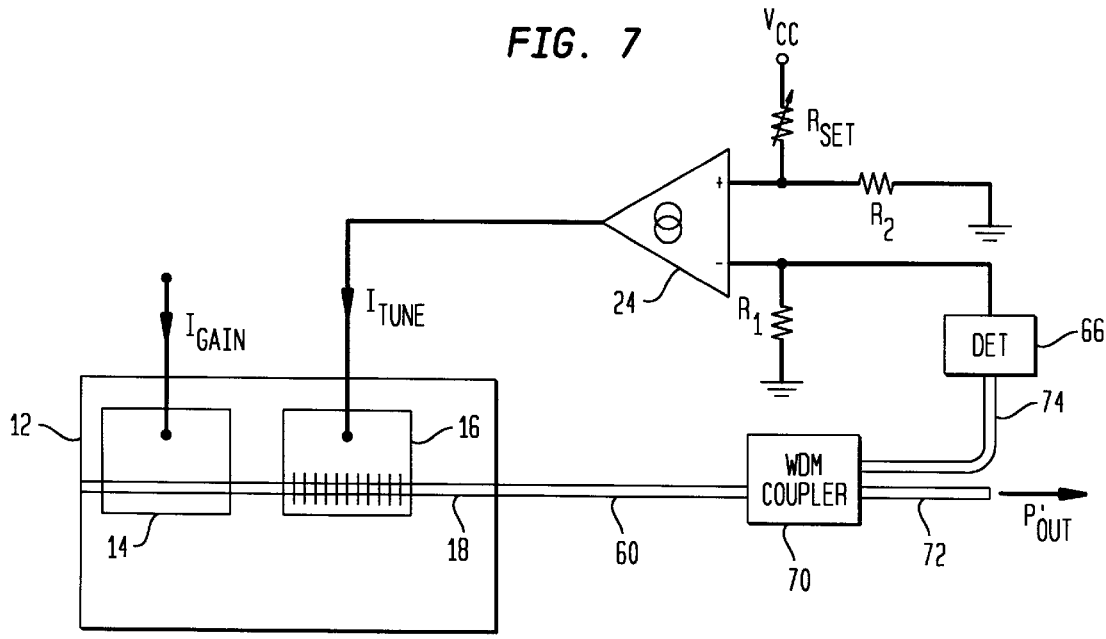
FIG. 7 shows an alternative implementation of an in-line monitoring technique suitable for use in detecting SE from the tuning section of the tunable laser of FIG. 5.

FIG. 7 shows an alternative embodiment of the wavelength-stabilized tunable laser of FIG. 5 in which the optical coupler 62 is implemented as a wavelength division multiplexed (WDM) coupler 70. The WDM coupler 70 separates the total optical output $P_{out}$ of the DBR chip 12 into a first channel coupled to an optical fiber 72 and a second channel coupled to an optical fiber 74. The first channel may be centered at a wavelength of about 1.55 μm, while the second channel is centered at a wavelength of about 1.3 μm. If the spectrum of the total output power $P_{out}$ generated by DBR chip 12 corresponds to that shown in FIG. 6, the first channel applied to optical fiber 72 will include the gain section SE and laser light, while the second channel applied to optical fiber 74 will include the tuning section SE. The tuning section SE is thus directed via WDM coupler 70 and fiber 74 to the SE detector 66. The detected tuning section SE is then used in a feedback control loop in which voltage-controlled current source 24 adjusts the tuning current $I_{tune}$ such that the tuning section SE is maintained at a predetermined level and the output laser light wavelength remains substantially constant. The wavelength channels of the WDM coupler are specified for optimum coupling of tuning section SE onto the fiber 74, with maximum rejection of gain section SE and laser light. The use of a WDM coupler as shown in FIG. 7 may provide a number of advantages over the FIG. 5 embodiment, such as improved sensitivity and reduced cost. It should be noted that the in-line SE monitoring techniques illustrated in FIGS. 5 and 7 may not be suitable for use with certain types of optical sources such as, for example, devices having electro-absorptive (EA) modulators which heavily attenuate the tuning section SE, devices in which the tuning section SE wavelengths are too close to the gain section SE or laser light wavelengths, or devices having multiple tuning sections which generate overlapping SE spectra. In these cases, embodiments such as those described in conjunction with FIGS. 1, 3 and 4 may still be used to provide wavelength stabilization.

Figure 8:
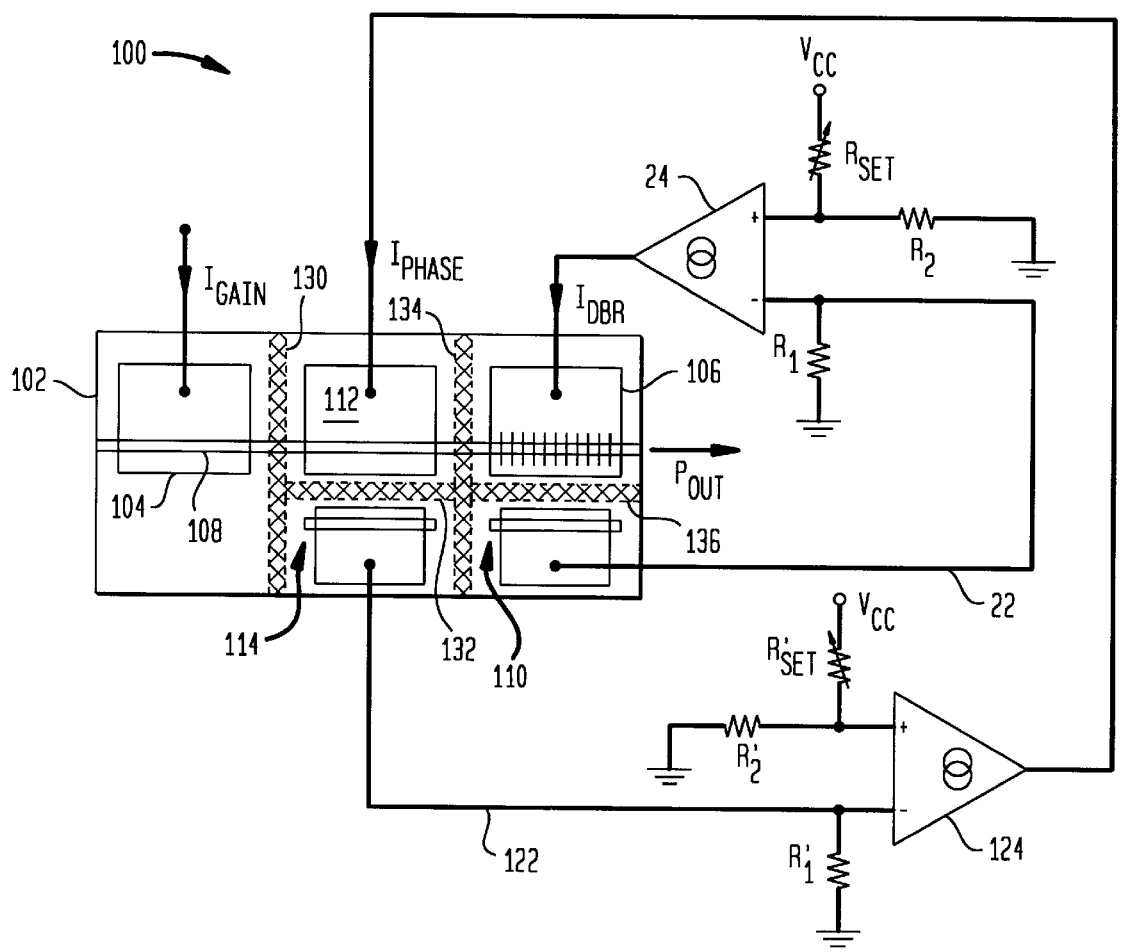
FIG. 8 shows an exemplary embodiment of a wavelength-stabilized tunable semiconductor laser with multiple tuning sections, SE detectors and feedback control loops in accordance with the invention.

FIG. 8 illustrates another alternative embodiment of the present invention which utilizes two feedback control loops to monitor and control detected SE signals from two different tuning sections of a tunable laser 100. The wavelength-stabilized tunable laser 100 shown in FIG. 8 includes a three-section DBR chip 102 having a gain section 104, a DBR tuning section 106 and a phase tuning section 112. The gain section 104, DBR tuning section 106 and phase tuning section 112 are driven by respective current signals $I_{gain}$, $I_{DBR}$ and $I_{phase}$. The three-section chip 102 generates a total optical output $P_{out}$ at the output of an optical waveguide 108 which passes over or through the sections 104, 106 and 112. The three-section chip 102 includes a first integrated SE detector 110 and a second integrated SE detector 114. The first detector 110 detects SE from the DBR tuning section 106 and supplies the resulting detected SE current signal via line 22 to an input of the voltage-controlled current source 24. The current source 24 uses the detected SE current signal to control the current $I_{DBR}$ applied to the DBR tuning section in a manner similar to that previously described in conjunction with FIG. 1 above. The first feedback control loop comprising detector 110, line 22 and current source 24 thus operates to maintain the detected SE from the DBR tuning section 106 at a first predetermined level, and thereby serves to stabilize the wavelength of the laser light at the output of the chip 102.

The second detector 114 detects SE from the phase tuning section 112 and supplies the resulting detected SE current signal via line 122 to an input of a second voltage-controlled current source 124. The second current source 124 operates in conjunction with resistors $R_1'$, $R_2'$ and $R_{set}'$ such that the voltage generated across resistor $R_1'$ by the detected SE current signal matches a set-point voltage established by a voltage divider of $R_2'$ and $R_{set}'$. The second feedback control loop comprising detector 114, line 122 and current source 124 thus operates to maintain the detected SE from the phase tuning section 112 at a second predetermined level, and thereby also serves in conjunction with the first feedback control loop to stabilize the wavelength of the output laser light. The DBR chip 102 further includes a number of implanted or etched isolation regions 130, 132, 134 and 136 which provide electrical isolation between the various sections of the chip 102 and the integrated detectors 110 and 114. This ensures that the light incident on the integrated detectors 110 and 114 will primarily include SE generated by the tuning sections 106 and 112, respectively. A given SE detector is thus arranged to detect SE generated by its corresponding tuning section, rather than gain section SE, non-SE laser light or SE from an adjacent tuning section. This is particularly advantageous in applications in which the tuning section SE spectra completely or partially overlap.

Figure 9:
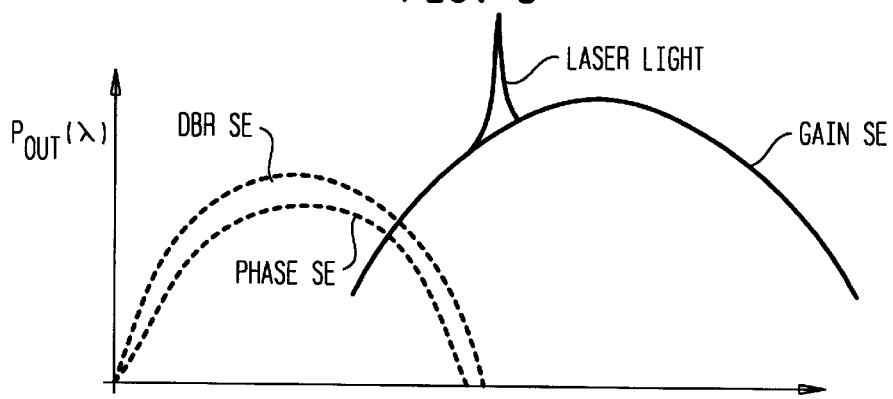
FIG. 9 is a plot of an optical output spectrum which may be generated by the multiple tuning section laser in the exemplary embodiment of FIG. 8.

FIG. 9 is a plot of an exemplary optical spectrum illustrating the total optical output $P_{out}$ as a function of wavelength λ which may be generated by the three-section DBR chip 102 of FIG. 8. The spectrum $P_{out}(\lambda)$ includes SE from the gain section 104, SE from the DBR tuning section 106, SE from the phase tuning section 112 and laser light. The SE from the DBR tuning section 106 and the SE from the phase tuning section 112 overlap in wavelength as shown. The embodiment of FIG. 8 allows both the SE from the DBR tuning section 106 and the SE from the phase tuning section 112 to be monitored simultaneously in two different feedback control loops by using two separate electrically-isolated detectors as previously described. It should be noted that the embodiment of FIG. 8 could be implemented using the external detector arrangements of FIGS. 3 and 4 as well as other detector arrangements, and could be readily extended to applications in which the optical source includes three or more tuning sections.

The above-described embodiments of the invention are intended to be illustrative only. Numerous alternative embodiments may be devised by those skilled in the art without departing from the scope of the following claims.

What is claimed is:

1. A method of controlling optical signal wavelength, the method comprising the steps of:
    detecting spontaneous emission from a tuning section of a tunable optical signal source; and
    utilizing the detected spontaneous emission in a feedback control loop to control the wavelength of an optical signal produced by the optical signal source.

2. The method of claim 1 wherein the step of utilizing the detected spontaneous emission in a feedback control loop further includes operating the feedback control loop such that the spontaneous emission is maintained at a substantially constant level.

3. The method of claim 1 wherein the step of detecting spontaneous emission from the tuning section further includes the steps of:
    configuring the tunable optical signal source to include a detector integrated on a common chip with the tuning section and a gain section, such that the detector is separated from the gain section by an isolation region; and
    detecting the spontaneous emission from the tuning section in the detector.

4. The method of claim 1 wherein the step of detecting spontaneous emission from the tuning section further includes the step of detecting the spontaneous emission in a detector located external to a chip containing the tuning section.

5. The method of claim 4 wherein the step of detecting the spontaneous emission in a detector located external to a chip containing the tuning section further includes the step of detecting the spontaneous emission in a p-i-n diode external detector supported on a mounting block and arranged to detect spontaneous emission emitted from a side of the tuning section.

6. The method of claim 4 wherein the step of detecting the spontaneous emission in a detector located external to a chip containing the tuning section further includes the step of detecting the spontaneous emission in an external detector arranged to detect spontaneous emission emitted from a side of the tuning section and focused onto the external detector via focusing optics.

7. The method of claim 1 wherein the step of detecting spontaneous emission from the tuning section further includes the steps of:
    detecting the spontaneous emission in a portion of an output of the optical source.

8. The method of claim 7 wherein the step of detecting the spontaneous emission in a portion of an output of the optical source further includes the step of applying the output of the optical source to a wavelength division multiplexed coupler.

9. The method of claim 7 further including the step of filtering the portion of the output of the optical source prior to the step of detecting the spontaneous emission in the portion of the output of the optical source.

10. The method of claim 1 wherein the optical signal source includes a plurality of tuning sections, the step of detecting spontaneous emission further includes the step of detecting spontaneous emission from said tuning sections using a corresponding plurality of detectors, and the step of utilizing the detected spontaneous emission in a feedback control loop further includes the step of utilizing the spontaneous emission detected from the plurality of tuning sections in a corresponding plurality of feedback control loops to control the optical signal wavelength.

11. The method of claim 10 wherein the plurality of tuning sections include a phase tuning section and a distributed Bragg reflector tuning section.

12. A wavelength-controlled tunable optical signal source comprising:
    at least one tuning section;
    a detector for detecting spontaneous emission from the tuning section of the optical signal source; and
    a feedback control loop in which the spontaneous emission detected by the detector is used to control the wavelength of an optical signal produced by the optical source.

13. The optical signal source of claim 12 wherein the feedback control loop is operative to maintain the detected spontaneous emission from the tuning section at a substantially constant level.

14. The optical signal source of claim 12 wherein the detector is integrated on a common chip with the tuning section and a gain section, and the detector is separated from the gain section by an isolation region.

15. The optical signal source of claim 12 wherein the detector is located external to a chip containing the tuning section.

16. The optical signal source of claim 15 wherein the detector is implemented as a p-i-n diode external detector supported on a mounting block and arranged to detect spontaneous emission emitted from a side of the tuning section.

17. The optical signal source of claim 15 wherein the detector is implemented as an external detector arranged to detect spontaneous emission emitted from a side of the tuning section and focused onto the external detector via focusing optics.

18. The optical signal source of claim 12 further including an optical coupler for coupling a portion of an output of the optical source, wherein the spontaneous emission is detected in the coupled portion.

19. The optical signal source of claim 18 wherein the optical coupler is a wavelength division multiplexed coupler.

20. The optical signal source of claim 18 further including a filter for filtering the coupled portion before the spontaneous emission is detected in that portion.

21. The optical signal source of claim 12 further including:
    a plurality of tuning sections;
    a plurality of detectors, with each of the detectors detecting spontaneous emission from a corresponding one of the plurality of tuning sections; and
    a plurality of feedback control loops, each of the control loops utilizing the spontaneous emission detected from one of the plurality of tuning sections to control the optical signal wavelength.

22. The optical signal source of claim 21 wherein the plurality of tuning sections include a phase tuning section and a distributed Bragg reflector tuning section.

* * * * *

UNITED STATES PATENT AND TRADEMARK OFFICE
CERTIFICATE OF CORRECTION

PATENT NO. : 5,832,014
DATED : November 3, 1998
INVENTOR(S) : John Evan Johnson

It is certified that error appears in the above-identified patent and that said Letters Patent is hereby corrected as shown below:

On the title page, item [56] References Cited, please add the following Publications:

OTHER DOCUMENTS

| |
|---|
| 1. S. L. Woodward et al., "The Effects of Aging on the Bragg Section of a DBR laser, "IEEE Photonics Technology Letters, Vol. 5, No. 7, pp. 750-752, July 1993. |
| 2. T. Coroy et al., "Active Wavelength Measurement System Using an InGaAs-InP Quantum-Well Electroabsorption Filtering Detector," IEEE Photonics Technology Letters, Vol. 8, No. 12, pp. 1686-1688, December 1996. |
| 3. M. Teshima and M. Koga, "100-GHz-Spaced 8-Channel Frequency Control of DBR Lasers for Virtual Wavelength Path Cross-Connect System," IEEE Photonics Technology Letters, Vol. 8, No. 12, pp. 1701-1703, December 1996. |
| 4. C.R. Giles and T.L. Koch, "Method for Setting the Absolute Frequency of a Tunable, 1.5 um Two-Section DBR Laser," IEEE Photonics Technology Letters, Vol. 2, No. 1, pp. 63-65, January 1990 |
| 5. S. L. Woodward et al., "A Control Loop Which Ensures High Side-Mode-Suppression Ratio in a Tunable DBR Laser," IEEE Photonics Technology Letters, Vol. 4, No. 5, pp. 417-419, May 1992. |

Signed and Sealed this

First Day of June, 1999

Attest:

Q. TODD DICKINSON

Attesting Officer

Acting Commissioner of Patents and Trademarks